(12) United States Patent
Yasuda et al.

(10) Patent No.: US 9,346,990 B2
(45) Date of Patent: May 24, 2016

(54) TEMPORARY ADHESIVE MATERIAL FOR WAFER PROCESSING, WAFER PROCESSING LAMINATE, AND METHOD FOR MANUFACTURING THIN WAFER USING SAME

(71) Applicant: SHIN-ETSU CHEMICAL CO., LTD., Tokyo (JP)

(72) Inventors: Hiroyuki Yasuda, Tomioka (JP); Michihiro Sugo, Takasaki (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/720,223

(22) Filed: May 22, 2015

(65) Prior Publication Data

US 2015/0353793 A1    Dec. 10, 2015

(30) Foreign Application Priority Data

Jun. 10, 2014  (JP) .................................. 2014-119579

(51) Int. Cl.
*H01L 21/304* (2006.01)
*H01L 21/683* (2006.01)
(Continued)

(52) U.S. Cl.
CPC *C09J 183/14* (2013.01); *C09J 5/04* (2013.01); *C09J 5/06* (2013.01); *C09J 7/00* (2013.01); *C09J 125/08* (2013.01); *C09J 153/005* (2013.01); *C09J 183/10* (2013.01); *H01L 21/187* (2013.01); *H01L 21/304* (2013.01); *H01L 21/6835* (2013.01); *H01L 21/6836* (2013.01);
(Continued)

(58) Field of Classification Search
USPC ......................................................... 438/459
See application file for complete search history.

(56) References Cited

U.S. PATENT DOCUMENTS 7,541,264 B2    6/2009   Gardner et al.
2005/0233547 A1 10/2005  Noda et al.
(Continued)

FOREIGN PATENT DOCUMENTS

EP    2 634 794 A1   9/2013
EP    2 738 797 A2   6/2014
(Continued)

OTHER PUBLICATIONS

Oct. 21, 2015 Extended Search Report issued in European Patent Application No. 15001695.4.

*Primary Examiner* — Asok K Sarkar
(74) *Attorney, Agent, or Firm* — Oliff PLC

(57) ABSTRACT

The invention is adhesive material for a wafer processing used for temporarily bonding a supporting substrate to wafer having a front surface includes circuit formed thereon and a back surface to be processed, including first temporary adhesive layer composed of a layer of a silicone-modified styrene base thermoplastic elastomer, and second temporary adhesive layer composed of a thermosetting polymer layer on first temporary adhesive layer, wherein layer is capable of releasably adhering to front surface of wafer, and layer is capable of releasably adhering to the supporting substrate. Thereby, it provides a temporary adhesive material for wafer processing, wafer processing lamination, and method for manufacturing thin wafer using same, which facilitates temporary adhesion between supporting substrate and wafer having a circuit, is highly compatible with steps of forming TSV and forming wiring on back surface of wafer, allows easy delamination, and is capable of increasing productivity of thin wafers.

20 Claims, 1 Drawing Sheet

(51) Int. Cl.
*C09J 183/14* (2006.01)
*C09J 153/00* (2006.01)
*C09J 5/04* (2006.01)
*C09J 5/06* (2006.01)
*C09J 7/00* (2006.01)
*C09J 125/08* (2006.01)
*C09J 183/10* (2006.01)
*H01L 21/18* (2006.01)

(52) U.S. Cl.
CPC ...... *C09J 2201/134* (2013.01); *C09J 2203/326* (2013.01); *C09J 2425/00* (2013.01); *C09J 2453/003* (2013.01); *C09J 2483/00* (2013.01); *H01L 2221/68327* (2013.01); *H01L 2221/68381* (2013.01); *Y10T 428/287* (2015.01); *Y10T 428/2848* (2015.01); *Y10T 428/2874* (2015.01); *Y10T 428/2878* (2015.01)

(56) References Cited

U.S. PATENT DOCUMENTS

| | | | | |
|---|---|---|---|---|
| 2007/0287242 A1* | 12/2007 | Kodaira | ............... | H01L 21/6835 438/197 |
| 2010/0003804 A1* | 1/2010 | Eguchi | ................ | H01L 27/1214 438/459 |
| 2010/0297829 A1* | 11/2010 | O'Rourke | ............ | H01L 21/6835 438/459 |
| 2011/0136321 A1* | 6/2011 | Kuroda | ................ | H01L 21/6835 438/459 |
| 2013/0280886 A1* | 10/2013 | Kato | ......................... | B32B 7/06 438/459 |
| 2014/0147989 A1 | 5/2014 | Luo et al. | | |
| 2014/0154868 A1* | 6/2014 | Sugo | .................... | H01L 21/6835 438/458 |
| 2014/0213039 A1* | 7/2014 | Lee | ...................... | H01L 21/6835 438/459 |
| 2014/0342530 A1* | 11/2014 | Yasuda | ................... | C09J 183/14 438/459 |
| 2015/0017434 A1* | 1/2015 | Dronen | .................... | B32B 38/10 428/352 |
| 2015/0034238 A1* | 2/2015 | Dronen | ............. | H01L 21/67092 156/247 |
| 2015/0064385 A1* | 3/2015 | Flaim | ...................... | B32B 37/14 428/41.3 |

FOREIGN PATENT DOCUMENTS

| | | |
|---|---|---|
| JP | 2004-64040 A | 2/2004 |
| JP | 2006-328104 A | 12/2006 |
| JP | 2014-037458 A | 2/2014 |

\* cited by examiner

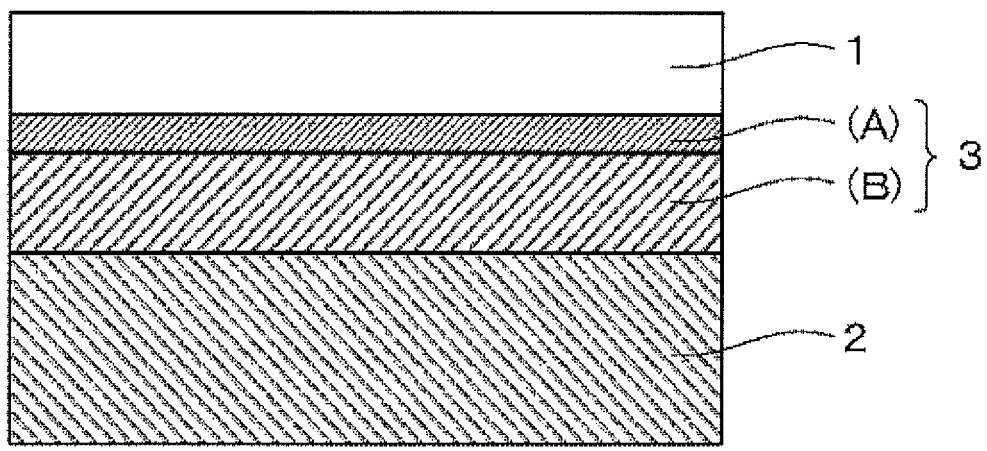

TEMPORARY ADHESIVE MATERIAL FOR WAFER PROCESSING, WAFER PROCESSING LAMINATE, AND METHOD FOR MANUFACTURING THIN WAFER USING SAME

TECHNICAL FIELD

The present invention relates to a temporary adhesive material for a wafer processing capable of effectively obtaining a thin wafer, a wafer processing laminate, and a method for manufacturing a thin wafer using the same.

BACKGROUND ART

Three-dimensional semiconductor mounting has become essential for further higher density, higher capacity, higher speed, and low power consumption. A three-dimensional semiconductor mounting technique is a semiconductor production technique for thinning a semiconductor chip, and connecting the chip to another chip using a through silicon via (TSV) to form a multilayer. In order to realize this technique, a step of grinding a non-circuit-formed surface (also referred to as "back surface") of a substrate on which a semiconductor circuit has been formed to thin the substrate, and forming an electrode including a TSV on the back surface is required.

Conventionally, in the step of grinding a back surface of a silicon substrate, a protective tape is attached to a surface opposite to a surface to be ground to prevent breakage of a wafer during grinding. However, this tape uses an organic resin film as a base material, which has flexibility, but inadequate strength and heat resistance. Therefore, the tape is not suited to the steps of forming a TSV and forming a wiring layer on the back surface.

For this reason, a system has been proposed in which a semiconductor substrate is bonded to a support (supporting substrate) of silicon, glass, or the like, through an adhesive layer to sufficiently withstand the steps of grinding a back surface and forming a TSV and an electrode on the back surface. In this system, the adhesive layer used in bonding the substrate to the support is important. The adhesive layer requires sufficient durability to bond the substrate to the support without gaps and withstand a subsequent step. Further, it is necessary that a thin wafer be easily delaminated from the support finally. The adhesive layer is referred herein to as "temporary adhesive layer" since it is finally delaminated.

As known temporary adhesive layer and method for delaminating the layer, a technique in which a silicone pressure sensitive adhesive is used for a temporary adhesive layer (Patent Literature 1), and a technique in which bonding and delaminating is carried out using a heat-melting hydrocarbon-based compound for an adhesive material in a heat molten state (Patent Literature 2) have been proposed. In the former technique, a substrate is bonded to a support using an addition-curable silicone pressure sensitive adhesive, and during delaminating, the substrate is immersed in a chemical agent which is capable of dissolving or decomposing a silicone resin, and then detached from the support. This technique requires a very long time for delaminating, so that application of this technique to an actual production process is difficult. The latter technique is simple because of control only by heating, but does not have sufficient heat stability at a high temperature higher than 200° C. Therefore, the applicable range is narrow.

Further, a technique in which an adhesive containing a light-absorbing substance is irradiated with high-intensity light to decompose a temporary adhesive layer, thereby delaminating a thin wafer from a support (Patent Literature 3), and a technique in which a combination of an adhesive containing a light-absorbing substance and an adhesive containing a styrene base elastomer is irradiated with high-intensity light, and the elastomer is then swollen by a solvent so as to be delaminated (Patent Literature 4) have been proposed. However, both the techniques require an expensive apparatus such as a laser, and suffer from a problem in which a processing time per substrate is extended, and particularly in the latter technique, the processing time is further extended due to the solvent treatment.

CITATION LIST

Patent Literature

PATENT LITERATURE 1: U.S. Pat. No. 7,541,264
PATENT LITERATURE 2: Japanese Patent Laid-Open Publication No. 2006-328104
PATENT LITERATURE 3: Japanese Patent Laid-Open Publication No. 2004-64040
PATENT LITERATURE 4: Japanese Patent Laid-Open Publication No. 2014-37458

SUMMARY OF THE INVENTION

Technical Problem

The present invention was accomplished in view of the above-described problems, and has an object to provide a temporary adhesive material for a wafer processing, a wafer processing lamination, and a method for manufacturing a thin wafer using the same, which facilitates temporary adhesion between a supporting substrate and a wafer having a circuit, is highly compatible with steps of forming a TSV and forming a wiring on the back surface of the wafer, allows easy delamination, and is capable of increasing productivity of thin wafers.

Solution to Problem

To solve the above-mentioned problems, the present invention provides a temporary adhesive material for a wafer processing, the temporary adhesive material being used for temporarily bonding a supporting substrate to a wafer having a front surface including a circuit formed thereon and a back surface to be processed, comprising: a first temporary adhesive layer composed of a layer (A) of a silicone-modified styrene base thermoplastic elastomer; and a second temporary adhesive layer composed of a thermosetting polymer layer (B) laminated on the first temporary adhesive layer, wherein the layer (A) is capable of releasably adhering to the front surface of the wafer, and the layer (B) is capable of releasably adhering to the supporting substrate.

Such a temporary adhesive material for a wafer processing (hereinafter, also referred to as "temporary adhesive material") facilitates temporary adhesion and delamination between a supporting substrate and a wafer having a circuit. Moreover, by temporarily bonding a supporting substrate to a wafer via a temporary adhesive layer composed of the temporary adhesive material, compatibility with steps of forming a TSV and forming a wiring on the back surface of the wafer can be enhanced. Moreover, resistance to thermal processing such as chemical vapor deposition (CVD) is excellent. In particular, a temporary adhesive layer with a uniform film thickness can be formed even on a substrate having a large difference in level, such as a wafer having a circuit. Thus, productivity of thin wafers can be increased.

Also, it is preferred that the silicone-modified styrene base thermoplastic elastomer be a silicone-modified block copolymer, and a content of a styrene unit in the copolymer be in the range of 10 to 40% by mass.

Such a temporary adhesive material has further excellent heat resistance. Moreover, the styrene content in the above range allows excellent solubility particularly to a hydrocarbon solvent and so on, and excellent washability after delamination.

Also, the silicone-modified styrene base thermoplastic elastomer preferably contains a silicone unit represented by the following general formula (1),

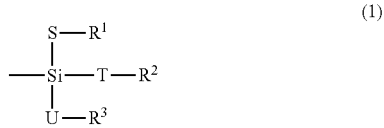
(1)

wherein $R^1$, $R^2$, and $R^3$ independently represent a substituted or unsubstituted monovalent hydrocarbon group having 1 to 10 carbon atoms; S, T, and U each are a single bond or a divalent siloxane structure represented by the following general formula (2), provided that at least one of S, T, and U is the divalent siloxane structure represented by the general formula (2),

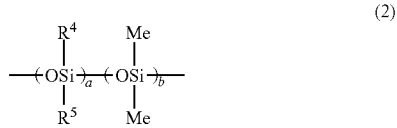
(2)

wherein $R^4$ and $R^5$ independently represent a substituted or unsubstituted monovalent hydrocarbon group having 1 to 10 carbon atoms; Me is a methyl group; "a" and "b" each are 0 or a positive number; and a+b is an integer of 1 or more.

When the first temporary adhesive layer contains such a silicone unit, adhesiveness to the second temporary adhesive layer can be controlled by adjusting the content of the silicone unit.

Also, a 180° peeling force of a test piece having a width of 25 mm of the layer (A) of the silicone-modified styrene base thermoplastic elastomer is preferably from 2 to 50 gf.

The layer (A) of the silicone-modified styrene base thermoplastic elastomer (hereinafter, also referred to as "polymer layer (A)") having such a peeling force is preferred since there is no fear of causing slippage of the wafer at the time of grinding the wafer, and delamination can be easily performed.

Also, the thermosetting polymer layer (B) is preferably a cured layer of a composition containing 100 parts by mass of a siloxane bond-containing polymer having a repeating unit represented by the following general formula (3) and a weight average molecular weight of 3,000 to 500,000, and 0.1 to 50 parts by mass of a crosslinker selected from the group consisting of an amino condensate, a melamine resin, a urea resin each modified with formalin or formalin-alcohol, a phenol compound having on average two or more methylol or alkoxymethylol groups per molecule, and an epoxy compound having on average two or more epoxy groups per molecule,

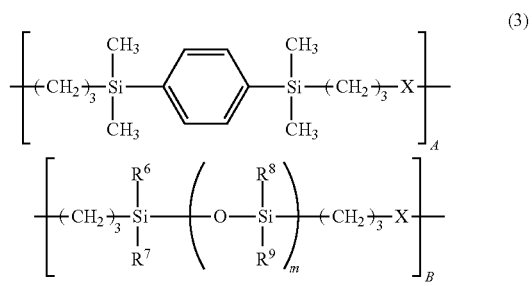
(3)

wherein $R^6$ to $R^9$ may be the same or different, and represent a monovalent hydrocarbon group having 1 to 8 carbon atoms; "m" is an integer of 1 to 100; B is a positive number; A is 0 or a positive number; and X is a divalent organic group represented by the following general formula (4),

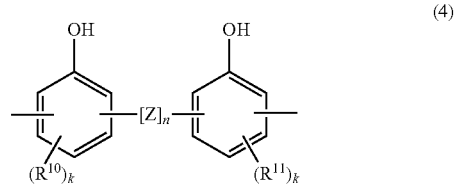
(4)

wherein Z represents a divalent organic group selected from any of

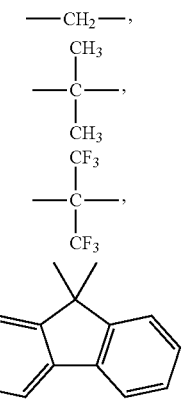

"n" represents 0 or 1; $R^{10}$ and $R^{11}$ each represent an alkyl or alkoxy group having 1 to 4 carbon atoms, and may be the same or different from each other; and "k" represents any of 0, 1, and 2.

Such a thermosetting polymer layer (B) (hereinafter, also referred to as "polymer layer (B)") is preferred since the temporary adhesive layer has further excellent heat resistance and good uniformity in film thickness.

The thermosetting polymer layer (B) is preferably a cured layer of a composition containing 100 parts by mass of a siloxane bond-containing polymer having a repeating unit represented by the following general formula (5) and a weight average molecular weight of 3,000 to 500,000, and 0.1 to 50 parts by mass of a crosslinker selected from the group consisting of a phenol compound having on average two or more phenol groups per molecule and an epoxy compound having on average two or more epoxy groups per molecule,

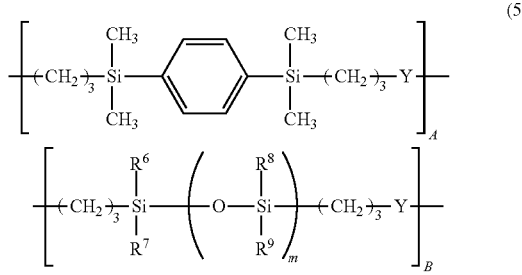

(5)

wherein $R^6$ to $R^9$ may be the same or different, and represent a monovalent hydrocarbon group having 1 to 8 carbon atoms; "m" is an integer of 1 to 100; B is a positive number; A is 0 or a positive number; and Y is a divalent organic group represented by the following general formula (6),

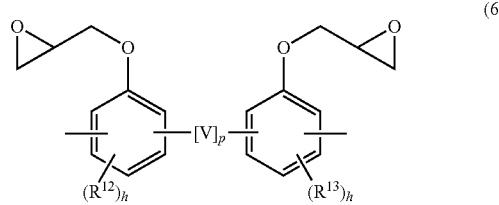

(6)

wherein V represents a divalent organic group selected from any of

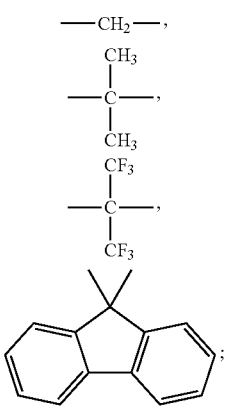

"p" represents 0 or 1; $R^{12}$ and $R^{13}$ each represent an alkyl or alkoxy group having 1 to 4 carbon atoms, and may be the same or different from each other; and "h" represents any of 0, 1, and 2.

Such a thermosetting polymer layer (B) is preferred since the temporary adhesive layer has further excellent heat resistance and good uniformity in film thickness.

Further, the present invention provides a wafer processing laminate comprising a supporting substrate, a temporary adhesive layer composed of the temporary adhesive material for a wafer processing of the present invention formed thereon, and a wafer laminated on the temporary adhesive layer, the wafer having a front surface including a circuit formed thereon and a back surface to be processed, wherein the first temporary adhesive layer releasably adheres to the front surface of the wafer, and the second temporary adhesive layer releasably adheres to the supporting substrate.

Such a wafer processing laminate facilitates temporary adhesion and delamination between a supporting substrate and a wafer having a circuit. Moreover, compatibility with steps of forming a TSV and forming a wiring on the back surface of the wafer can be enhanced. Thus, productivity of thin wafers can be increased.

Further, the present invention provides a method for manufacturing a thin wafer comprising the steps of:

bonding a front surface of a wafer to a supporting substrate via a temporary adhesive layer composed of the temporary adhesive material for a wafer processing of the present invention, the wafer having the front surface including a circuit formed thereon and a back surface to be processed;

heat curing the thermosetting polymer layer (B); grinding or polishing the back surface of the wafer bonded to the supporting substrate;

processing the ground or polished back surface of the wafer; and delaminating the processed wafer from the supporting substrate.

According to such a method for manufacturing a thin wafer, a temporary adhesive layer including two layers of the present invention is used to bond a wafer to a supporting substrate. Thus, a thin wafer having a through electrode structure or a bump connection structure can be easily produced.

Also, the temporary adhesive layer remaining on the front surface of the delaminated wafer is preferably removed after the step of delaminating.

Such a method for manufacturing a thin wafer can provide a wafer in which the temporary adhesive layer is completely removed, even if the temporary adhesive layer remains on the front surface of the wafer after the step of delaminating.

Also, it is preferred that, in the step of bonding, the first temporary adhesive layer be formed on the front surface of the wafer, the second temporary adhesive layer be formed on the supporting substrate, and the front surface of the resultant wafer be bonded to the resultant supporting substrate, or the first temporary adhesive layer be formed on the front surface of the wafer, the second temporary adhesive layer be then formed on the first temporary adhesive layer, and the front surface of the resultant wafer be bonded to the supporting substrate.

According to such a method for manufacturing a thin wafer, in the former case, the second temporary adhesive layer can be formed on the supporting substrate by using a spin coating method or the like, and then bonding can be performed, regardless of front surface state of the wafer. In the latter case, the second temporary adhesive layer can be formed by a spin coating method or the like without a residue of the second temporary adhesive layer being on a side surface of the supporting substrate. Therefore, there is no fear of peeling off the residue in a subsequent process.

Advantageous Effects of Invention

The temporary adhesive material of the present invention enables a temporary adhesive layer with high uniformity in film thickness to be formed even on a wafer having a circuit (a wafer having steps). Because of the uniformity in film thickness, a thin wafer having a uniform thickness of 50 μm or less can be easily obtained. Further, since the first temporary adhesive layer is composed of the silicone-modified styrene base thermoplastic elastomer, the wafer can be easily delaminated from the supporting substrate after thinning the wafer. Therefore, a brittle thin wafer can be easily handled without causing damage, and a thin wafer can be easily produced. Moreover, the delaminated supporting substrate can be reused after cleaning, thereby reducing the cost of production.

BRIEF DESCRIPTION OF DRAWINGS

FIG. 1 is a cross-sectional view of an exemplary wafer processing laminate of the present invention.

DESCRIPTION OF EMBODIMENTS

Hereinafter, the present invention will be described in detail.

As described above, the development of a temporary adhesive material for a wafer processing, a wafer processing lamination, and a method for manufacturing a thin wafer using the same, which facilitates temporary adhesion between a supporting substrate and a wafer having a circuit, is highly compatible with steps of forming a TSV and forming a wiring on the back surface of the wafer, allows easy delamination, and is capable of increasing productivity of thin wafers has been expected.

The present inventors earnestly studied to accomplish the above mentioned objects and consequently found that when a wafer is bonded to a supporting substrate by using a temporary adhesive material including a first temporary adhesive layer composed of a layer (A) of a silicone-modified styrene base thermoplastic elastomer that is capable of releasably adhering to a front surface of a wafer, and a second temporary adhesive layer composed of a thermosetting polymer layer (B) that is laminated on the first temporary adhesive layer and is capable of releasably adhering to a supporting substrate, a thin wafer having a through electrode structure or a bump connection structure can be easily delaminated from a supporting substrate, and the thin wafer can be easily produced, thereby bringing the present invention to completion.

Hereinafter, embodiments of the present invention will be described in detail, but the present invention is not limited thereto.

FIG. 1 is a cross-sectional view of an exemplary wafer processing laminate of the present invention. As shown in FIG. 1, the wafer processing laminate 10 of the present invention has a wafer 1 having a circuit-formed front surface and a back surface to be processed, a supporting substrate 2 supporting the wafer 1 at the time of processing the wafer 1, and a temporary adhesive material for a wafer processing (temporary adhesive layer) 3 intervening between the wafer 1 and the supporting substrate 2. The temporary adhesive layer 3 includes a layer (A) of a silicone-modified styrene base thermoplastic elastomer (first temporary adhesive layer) and a thermosetting polymer layer (B) (second temporary adhesive layer). The first temporary adhesive layer releasably adheres to the front surface of the wafer 1, and the second temporary adhesive layer laminated on the first temporary adhesive layer releasably adheres to the supporting substrate 2.

Also, the temporary adhesive material for a wafer processing of the present invention includes a laminated material of the polymer layer (A) and the polymer layer (B) mentioned above.

Hereinafter, the present invention will be described in more detail, but the present invention is not limited thereto.
Temporary Adhesive Layer
—First Temporary Adhesive Layer (A)/Silicone-Modified Styrene Base Thermoplastic Elastomer Layer—

The first temporary adhesive layer of the present invention is a layer including a silicone-modified styrene base thermoplastic elastomer. The silicone-modified styrene base thermoplastic elastomer (hereinafter, also referred to as "elastomer (A)") is, for example, an elastomer including a silicone unit and a styrene unit.

The elastomer (A) can be obtained by reacting a styrene base elastomer with siloxane, for example. In this case, the styrene base elastomer may be a homopolymer, or a copolymer obtained by copolymerization of styrene with a monomer having an alkenyl group such as vinyl group. The copolymer may be a random copolymer or a block copolymer. Illustrative examples of the monomer having an alkenyl group include diene compounds such as butadiene and isoprene. Also, the alkenyl group has preferably 2 to 10 carbon atoms, more preferably 3 to 6 carbon atoms.

For example, if the styrene base elastomer is a copolymer of styrene and diene compound, the elastomer (A) can be obtained by reacting a vinyl group remaining in this copolymer with siloxane.

Examples of the styrene base elastomer include a styrene base elastomer containing an alkenyl group (A-1) (hereinafter, also referred to as "elastomer (A-1)"). The elastomer (A-1) is any elastomer containing an alkenyl group and a styrene unit. Among these, a block copolymer in which both ends are blocked by styrene is preferable in view of heat resistance. Also, the content of the styrene unit in the polymer is preferably in the range of 10 to 40% by mass, more preferably 20 to 35% by mass. If the styrene content is in the above range, the elastomer (A) excellent in solubility and washability after delamination can be obtained.

Illustrative examples of the elastomer (A-1) include styrene block copolymers such as Kraton D [non-hydrogenated styrene-butadiene-styrene block copolymer: SBS, which is available from Kraton Polymers Japan Ltd.] and HYBRAR 5125, 5127 [non-hydrogenated styrene-isoprene-styrene block copolymer: SIS, which are available from Kuraray Co., Ltd.].

Also, the weight average molecular weight of the styrene base elastomer is preferably in the range of about 5,000 to 200,000, more preferably about 10,000 to 100,000. If it is more than 5,000, the elastomer (A) with improved heat resistance can be obtained. If it is less than 200,000, the elastomer (A) to be obtained is easily dissolved in a hydrocarbon solvent, and can be removed easily and rapidly.

The silicone unit in the elastomer (A) is preferably represented by the following general formula (1),

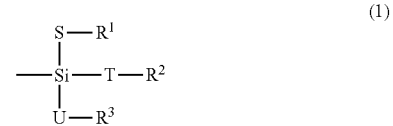

(1)

wherein $R^1$, $R^2$, and $R^3$ independently represent a substituted or unsubstituted monovalent hydrocarbon group having 1 to 10 carbon atoms; S, T, and U each are a single bond or a divalent siloxane structure represented by the following general formula (2), provided that at least one of S, T, and U is the divalent siloxane structure represented by the general formula (2),

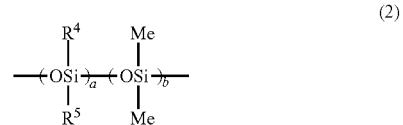

(2)

wherein $R^4$ and $R^5$ independently represent a substituted or unsubstituted monovalent hydrocarbon group having 1 to 10 carbon atoms; Me is a methyl group; "a" and "b" each are 0 or a positive number; and a+b is an integer of 1 or more. Preferably, a+b is an integer of 1 to 100.

A method for producing the elastomer (A) containing the silicone unit represented by the general formula (1) is not particularly limited, but the elastomer may be obtained by hydrosilylation reaction between an organohydrogenpolysiloxane containing one SiH group per molecule represented by the following general formula (7), and the styrene base elastomer containing an alkenyl group (A-1), in the presence of a platinum group metal-based catalyst,

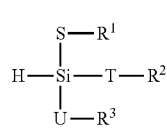

(7)

wherein $R^1$, $R^2$, and $R^3$ each independently represent a substituted or unsubstituted monovalent hydrocarbon group having 1 to 10 carbon atoms; S, T, and U each are a single bond or a divalent siloxane structure represented by the following general formula (8), provided that at least one of S, T, and U is the divalent siloxane structure represented by the general formula (8),

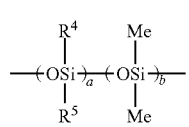

(8)

wherein $R^4$ and $R^5$ independently represent a substituted or unsubstituted monovalent hydrocarbon group having 1 to 10 carbon atoms; Me is a methyl group; "a" and "b" each are 0 or a positive number; and a+b is an integer of 1 or more. At this time, the total amount of SiH groups in the siloxane represented by the general formula (7) is preferably 0.1 to 1.0 times the total amount of alkenyl groups in the elastomer (A-1).

$R^1$ to $R^5$ represent a substituted or unsubstituted monovalent hydrocarbon group having 1 to 10 carbon atoms. Illustrative examples thereof include an alkyl group such as a methyl group, an ethyl group, a propyl group, and a butyl group; and a group in which a part or all of hydrogen atoms in these alkyl groups is/are substituted by a halogen atom(s) or the like.

In the reaction of the elastomer (A-1) and the siloxane represented by the general formula (7), for example, the elastomer (A-1) is dissolved in an organic solvent, a platinum group metal-based catalyst is added as a hydrosilylation catalyst, and the siloxane represented by the general formula (7) is then added dropwise under heating at 50 to 150° C., to obtain the silicone-modified styrene base thermoplastic elastomer (A).

The platinum group metal-based catalyst serves to promote hydrosilylation addition reaction of an alkenyl group and an SiH group. Examples of this addition reaction catalyst include a platinum-based catalyst such as platinum black, platinic chloride, chloroplatinic acid, a reaction product of chloroplatinic acid with monohydric alcohol, a complex of chloroplatinic acid with olefins, and platinum bisacetoacetate; and a platinum group metal catalyst such as a palladium-based catalyst and a rhodium-based catalyst. The amount of the addition reaction catalyst to be added can be a catalytic amount, but in general, it is preferable that the platinum group metal be added in a ratio of 1 to 800 ppm, especially about 2 to 300 ppm, relative to the weight of the siloxane represented by the general formula (7).

As for the silicone content of the elastomer (A) containing the silicone unit represented by the general formula (1) after the addition reaction, the siloxane represented by the general formula (7) is preferably 1 to 30 parts by mass, more preferably 3 to 20 parts by mass, based on 100 parts by mass of the styrene base elastomer containing an alkenyl group (A-I). When the elastomer (A) is used as the first temporary adhesive layer, the siloxane in an amount of 1 part by mass or more allows excellent delaminatability. If the amount is 30 parts by mass or less, heat resistance is not reduced.

Also, the silicone-modified styrene base thermoplastic elastomer is preferably a silicone-modified block copolymer.

The silicone-modified block copolymer can be obtained by reacting the above-mentioned styrene block copolymer with siloxane. For example, in a method for producing the elastomer (A) containing the silicone unit represented by the general formula (1), if the elastomer (A-1) is the styrene block copolymer, a silicone-modified block copolymer containing the silicone unit represented by the general formula (1) can be obtained as the elastomer (A).

Also, the content of the styrene unit in the silicone-modified block copolymer is preferably in the range of 10 to 40% by mass. If the styrene content is in such a range, solubility to a hydrocarbon solvent and washability after delamination are excellent. The content of the styrene unit in the silicone-modified block copolymer can be set in the above range by adjusting the content of the styrene unit in the styrene block copolymer to be used as a raw material, or adjusting the blending ratio of the styrene block copolymer to the siloxane.

If the first temporary adhesive layer is composed of such an elastomer (A), adhesiveness to the second temporary adhesive layer can be controlled, and heat resistance and delaminatability are excellent, so that it is preferable. Especially, the first temporary adhesive layer composed of the elastomer (A) containing the silicone unit represented by the general formula (1) facilitates to control adhesiveness to the second temporary adhesive layer by adjusting the content of the siloxane represented by the general formula (7), relative to the elastomer (A-1). Moreover, the first temporary adhesive layer composed of the silicone-modified block copolymer has further excellent heat resistance.

This silicone-modified styrene base elastomer layer is formed by dissolving the elastomer in a solvent, and applying the solution onto a semiconductor substrate such as a silicon wafer, by means of spin coating, spray coating, or the like. The solvent may be mentioned a hydrocarbon solvent, preferably such as nonane, p-menthane, pinene, and isooctane. Among these, nonane, p-menthane, and isooctane are particularly preferable because of their coating property.

Also, the silicone-modified styrene base thermoplastic elastomer layer (A) is preferably formed with a film thickness of 0.1 to 30 μm, more preferably 1 to 20 μm, and used. If the film thickness is 0.1 μm or more, whole surfaces of the wafer can be coated without uneven coating. If the film thickness is 30 μm or less, it can withstand to the grinding step for forming a thin wafer whereby it is preferred.

Also, the silicone-modified styrene base thermoplastic elastomer layer (A) has a 180° peeling force of generally 2 to 50 gf, preferably 3 to 30 gf, further preferably 5 to 20 gf, when the peeling force is measured by a test piece thereof with 25 mm width constituted of polyimide etc. If the peeling force is 2 gf or more, there is no fear of causing slippage of the wafer at the time of grinding the wafer. If it is 50 gf or less, the wafer can be easily delaminated whereby it is preferred.

As a method for measuring peeling force, for example, a method in which the polymer layer (B) is formed on the supporting substrate, the polymer layer (A) is formed thereon, a polyimide tape is then adhered, and a part of the temporary adhesive layer at which no tape has been adhered is removed to measure the peeling force by using AUTOGRAPH (AG-1) manufactured by Shimadzu Corporation may be mentioned.

Also, to the thermoplastic resin (elastomer (A)) may be added an antioxidant for enhancing heat resistance, or a surfactant for improving coating property. Illustrative examples of the antioxidant may be mentioned di-tert-butylphenol, etc., and suitably used. Examples of the surfactant may be mentioned a fluorine-containing silicone type surfactant X-70-1102 (available from Shin-Etsu Chemical Co., Ltd.), etc., and suitably used.

—Second Temporary Adhesive Layer (B)/Thermosetting Polymer Layer—

The thermosetting polymer layer (B) of the present invention is not limited so long as it is a thermosetting polymer layer, but preferably is a cured layer of a thermosetting composition mainly containing a thermosetting modified siloxane polymer represented by either of the following general formula (3) or (5). The polymer layer (B) may be a combination of the polymers represented by the general formulae (3) and (5). In this case, the (polymerization) ratio of (3):(5) is preferably from 0.1:99.9 to 99.9:0.1, more preferably from 1:99 to 99:1.

Polymer of Formula (3):

A polymer of the general formula (3) contains organosiloxane bonds and phenol groups. This polymer has a repeating unit represented by the general formula (3) and a weight average molecular weight of 3,000 to 500,000,

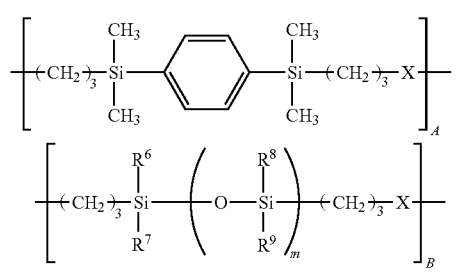

wherein $R^6$ to $R^9$ may be the same or different, and represent a monovalent hydrocarbon group having 1 to 8 carbon atoms; "m" is an integer of 1 to 100; B is a positive number; A is 0 or a positive number; and X is a divalent organic group represented by the following general formula (4),

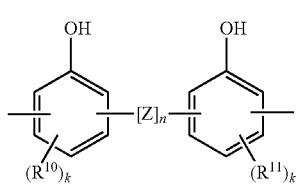

wherein Z represents a divalent organic group selected from any of

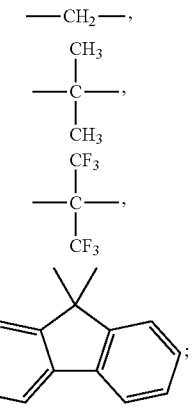

"n" represents 0 or 1; $R^{10}$ and $R^{11}$ each represent an alkyl or alkoxy group having 1 to 4 carbon atoms, and may be the same or different from each other; and "k" represents any of 0, 1, and 2.

In this case, illustrative examples of $R^6$ to $R^9$ include a methyl group, an ethyl group, and a phenyl group. "m" represents an integer of preferably 3 to 60, more preferably 8 to 40. A-I-B=1, and B/A is 0 to 20, in particular 0.5 to 5.

Polymer of Formula (5):

A polymer of the general formula (5) is a silicone polymer containing epoxy groups. This polymer has a repeating unit represented by the general formula (5) and a weight average molecular weight of 3,000 to 500,000,

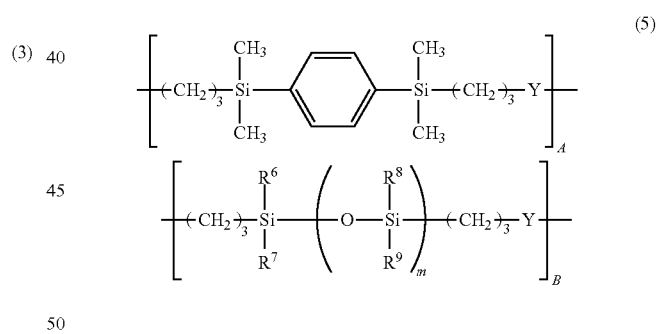

wherein $R^6$ to $R^9$ may be the same or different, and represent a monovalent hydrocarbon group having 1 to 8 carbon atoms; "m" is an integer of 1 to 100; B is a positive number; A is 0 or a positive number; and Y is a divalent organic group represented by the following general formula (6),

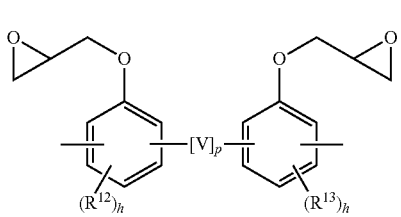

wherein V represents a divalent organic group selected from any of

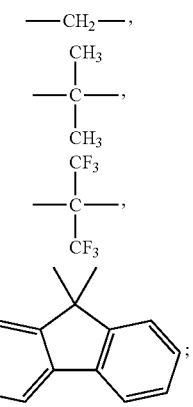

"p" represents 0 or 1; $R^{12}$ and $R^{13}$ each represent an alkyl or alkoxy group having 1 to 4 carbon atoms, and may be the same or different from each other; and "h" represents any of 0, 1, and 2.

In this case, illustrative examples of $R^6$ to $R^9$ and "m" are the same as in the above-mentioned formula (3). Also, A+B=1.

The thermosetting composition mainly containing the thermosetting modified siloxane polymer of the general formula (3) or (5) contains one or more crosslinkers for heat curing. In the case of the phenolic siloxane polymer of the general formula (3), the crosslinker is selected from an amino condensate, a melamine resin, a urea resin each modified with formalin or formalin-alcohol, a phenol compound having on average two or more methylol or alkoxymethylol groups per molecule, and an epoxy compound having on average two or more epoxy groups per molecule.

Here, an amino condensate, a melamine resin, a urea resin each modified with formalin or formalin-alcohol may be exemplified by the following. For example, an melamine resin (condensate) modified with formalin or formalin-alcohol can be obtained by addition condensation polymerization of a modified melamine monomer (e.g. trimethoxymethyl monomethylol melamine), or a polymer thereof (e.g. oligomer such as dimer and trimer) with formaldehyde until a desired molecular weight is achieved, according to a known method. These compounds may be used alone or in admixture of two or more.

Also, a urea resin (condensate) modified with formalin or formalin-alcohol can be prepared by modifying a urea condensate having a desired molecular weight with formalin into a methylol form, and optionally, further modifying the resultant compound with an alcohol into an alkoxy form, according to a known method. Illustrative examples of the urea resin modified with formalin or formalin-alcohol include methoxymethylated urea condensate, ethoxymethylated urea condensate, and propoxymethylated urea condensate. These compounds may be used alone or in admixture of two or more.

Illustrative examples of the phenol compound having on average two or more methylol or alkoxymethylol groups per molecule include (2-hydroxy-5-methyl)-1,3-benzenedimethanol and 2,2',6,6'-tetramethoxymethyl-bisphenol A. These phenol compounds may be used alone or in admixture of two or more.

On the other hand, in the case of the epoxy modified siloxane polymer of the general formula (5), the composition contains one or more crosslinkers selected from an epoxy compound having on average two or more epoxy groups per molecule and a phenol compound having on average two or more phenol groups per molecule.

Here, the epoxy compound having a polyfunctional epoxy group used in the polymers of the general formulae (3) and (5) is not particularly limited, and in particular, a bi-functional, a tri-functional, or a tetra-functional or more of the polyfunctional epoxy resins, for example, EOCN-1020, EOCN-102S, XD-1000, NC-2000-L, EPPN-201, GAN, and NC6000 all available from Nippon Kayaku Co., Ltd., or a closslinker represented by the following formula may be contained.

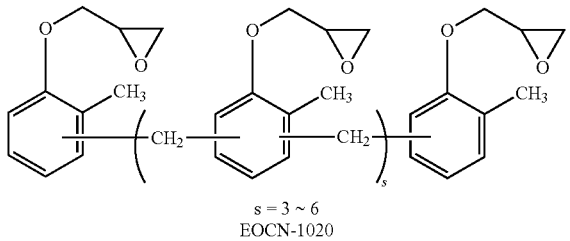

s = 3 ~ 6
EOCN-1020

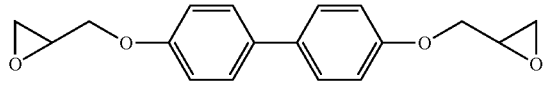

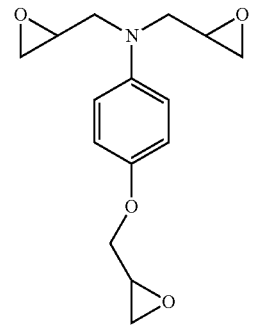

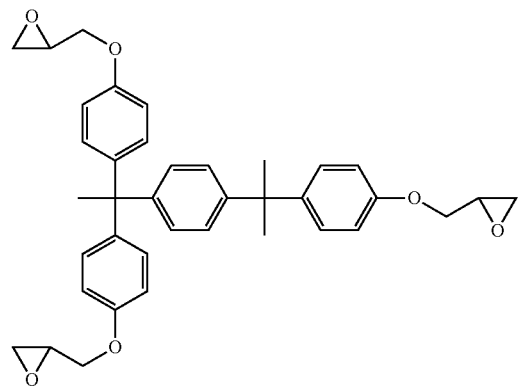

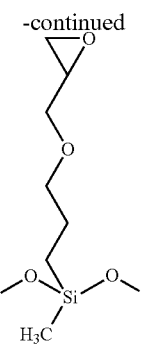

R = methyl group or ethyl group

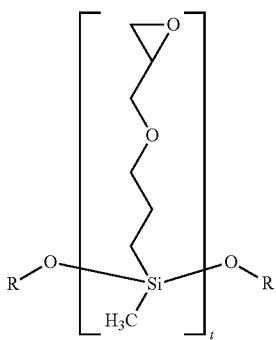

R = methyl group or ethyl group t = 1  20%
t = 2  75%
t ≥ 3  5%

When the thermosetting modified siloxane polymer is the epoxy-modified siloxane polymer of the general formula (5), the crosslinker thereof may be mentioned a m- or p-series cresol-novolac resin such as EP-6030G available from Asahi Organic Chemicals Industry Co., Ltd., tri-functional phenol compound such as Tris-P-PA4 available from Honshu Chemical Industry Co., Ltd., and tetra-functional phenol compound such as TEP-TPA available from Asahi Organic Chemicals Industry Co., Ltd., etc.

A formulation amount of the crosslinker is 0.1 to 50 parts by mass, preferably 0.1 to 30 parts by mass, more preferably 1 to 20 parts by mass based on 100 parts by mass of the thermosetting modified siloxane polymer, and may be formulated in admixture of two or more.

A curing catalyst such as an acid anhydride may be added in an amount of 10 parts by mass or less based on 100 parts by mass of the thermosetting modified siloxane polymer.

Also, the thermosetting modified siloxane polymer may be dissolved in a solvent, and applied to the supporting substrate specifically by a method such as spin coating, roll coater, and die coater, to form a layer. In such a case, illustrative examples of the solvent include ketones such as cyclohexanone, cyclopentanone, and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxy propionate, tert-butyl acetate, tert-butyl propionate, propylene glycol mono-tert-butyl ether acetate, and γ-butyrolactone. These solvents may be used alone or in admixture of two or more.

Incidentally, a known antioxidant, a filler such as silica, may be added in an amount of 50 parts by mass or less based on 100 parts by mass of the thermosetting modified siloxane polymer to further enhance heat resistance. Moreover, a surfactant may be added to improve coating uniformity.

Illustrative examples of the antioxidant that can be added into the thermosetting modified siloxane polymer include hindered phenol-based compounds such as tetrakis[methylene-(3,5-di-tert-butyl-4-hydroxyhydrocinnamate)]methane (trade name: Adekastab AO-60).

The polymer layer (B) composed of the above-mentioned thermosetting modified siloxane polymer preferably has a film thickness of 15 to 150 μm at the time of curing, depending on the steps at the wafer side, and more preferably to form a film with 20 to 120 μm. If the film thickness is 15 μm or more, it can sufficiently withstand to the grinding step for thinning the wafer, while if it is 150 μm or less, there is no fear of generating resin deformation in the heat treatment step such as TSV formation step, and it can endure for practical use whereby it is preferred.

<Method for Manufacturing a Thin Wafer>

The method for manufacturing a thin wafer of the present invention is characterized by using a temporary adhesive layer composed of two layers of the silicone-modified styrene base thermoplastic elastomer layer (A) and the thermosetting polymer layer (B) as an adhesive layer for bonding the supporting substrate to the wafer having a semiconductor circuit and so on. The thickness of the thin wafer manufactured by the method of the present invention is typically 5 to 300 μm, more typically 10 to 100

[Step (a)]

Step (a) is a step of bonding a front surface of a wafer to a supporting substrate via a temporary adhesive layer composed of the temporary adhesive material for a wafer processing of the present invention, in which the wafer has the front surface including a circuit and a back surface to be processed, i.e. the wafer has a circuit-formed surface and a non-circuit-formed surface.

In the step (a), it is preferred that, (1) the first temporary adhesive layer (polymer layer (A)) be formed on the front surface of the wafer, the second temporary adhesive layer (polymer layer (B)) be formed on the supporting substrate, and the front surface of the resultant wafer be bonded to the resultant supporting substrate, or (2) the first temporary adhesive layer be formed on the front surface of the wafer, the second temporary adhesive layer be then formed on the first temporary adhesive layer, and the front surface of the resultant wafer be bonded to the supporting substrate. At this time, bonding is preferably performed in a vacuum.

According to such a method, in the case of (1), the second temporary adhesive layer can be formed on the supporting substrate by using a spin coating method or the like, and then bonding can be performed, regardless of front surface state of the wafer. Also, in the case of (2), the second temporary adhesive layer can be formed by a spin coating method or the like without a residue of the second temporary adhesive layer being on a side surface of the supporting substrate. Therefore, there is no fear of peeling off the residue in a subsequent process.

The wafer having the circuit-formed surface and the non-circuit-formed surface is a wafer one of the surfaces of which is a circuit-formed surface, and the other surface of which is a non-circuit-formed surface. The wafer to which the present invention can be applied is generally a semiconductor wafer. Examples of the semiconductor wafer may be mentioned not only a silicon wafer, but also a germanium wafer, a gallium-arsenic wafer, a gallium-phosphorus wafer, a gallium-arsenic-aluminum wafer, etc. The thickness of the wafer is not particularly limited, but typically 600 to 800 μm, more typically 625 to 775 μm.

As the supporting substrate, a substrate such as a silicon wafer, a glass plate, and a quartz wafer can be used, but it is not particularly limited. In the present invention, it is not necessary to irradiate an energy beam to the temporary adhesive layer through the supporting substrate, so that the supporting substrate does not require light transmittance.

The temporary adhesive layers (polymer layers) (A) and (B) may be each formed as films on the wafer or the supporting substrate. Alternatively, the layers may be each formed by applying the respective solutions to the wafer or the supporting substrate by a spin coating method or the like. In this case, after the spin coating, the layers are prebaked at 80 to 200° C. depending on the volatile conditions of the used solvent, and then used.

The wafer and the supporting substrate on which the temporary adhesive layers (A) and (B) have been formed are formed as a substrate that is bonded via the layer (A) (polymer layer (A)) and the layer (B) (polymer layer (3)). At this time, this substrate is adhered by uniform compression under reduced pressure at a temperature ranging preferably from 40 to 200° C., more preferably from 60 to 180° C., thereby forming a wafer processing laminate (laminated substrate) in which the wafer are bonded to the supporting substrate.

Examples of a wafer bonding apparatus include a commercially available wafer bonding apparatus, such as EVG520IS and 850 TB manufactured by EV Group, and XBC300 manufactured by SUSS MicroTec AG.

[Step (b)]
Step (b) is a step of heat curing the thermosetting polymer layer (B). After forming the above-mentioned wafer processing laminate (laminated substrate), it is heated at 120 to 220° C., preferably 150 to 200° C., for 10 minutes to 4 hours, preferably 30 minutes to 2 hours, to cure the polymer layer (B).

[Step (c)]
Step (c) is a step of grinding or polishing the back surface of the wafer bonded to the supporting substrate, in other words, a step of grinding or polishing the wafer processing laminate obtained by bonding in the step (a) from the wafer back surface side to reduce the thickness of the wafer. The technique for grinding the wafer back surface is not particularly limited, and conventionally known grinding techniques may be used. It is preferable that the non-circuit-formed surface of the wafer processing laminate be ground while feeding water to a grinding wheel (e.g. diamond) for cooling. Examples of an apparatus for grinding the wafer back surface include DAG-810 (trade name) manufactured by DISCO Co., Ltd. Also, the wafer back surface side may be subjected to CMP polishing.

[Step (d)]
Step (d) is a step of processing the ground or polished back surface of the wafer. Particularly, it is a step of processing the back surface of the wafer processing laminate that has been thinned by grinding the back surface. This step includes various processes applied in the wafer level. Examples thereof include electrode formation, metal wiring formation, and protective film formation. More specifically, well-known processes such as metal sputtering for forming electrodes and so on, wet etching for etching a sputtered metal layer, patterning process in which a resist is applied and subjected to exposure and development to form a pattern used as a mask for metal wiring formation, resist removal, dry etching, formation of a metal plating, silicon etching to form a TSV, and formation of an oxide film on silicon surface may be mentioned.

[Step (e)]
Step (e) is a step of delaminating the wafer processed in the step (d) from the supporting substrate, in other words, a step of delaminating the thinned wafer that has been subjected to various processes from the supporting substrate, before dicing. This delaminating step is generally carried out under relatively low temperature conditions from room temperature to about 60° C. Examples thereof include a method in which either of the wafer or the supporting substrate of the wafer processing laminate is horizontally fixed, and the other is lifted at a certain angle with respect to the horizontal direction, and a method in which a protective film is adhered to the ground surface of the wafer, and then the wafer and the protective film are delaminated from the wafer processing laminate by peeling. To the present invention, either of these delaminating methods can be applied. These delaminating methods are usually carried out at room temperature.

Also, the step (e) of delaminating the processed wafer from the supporting substrate preferably includes the steps of
(f) adhering a dicing tape to the wafer surface (back surface) of the processed wafer,
(g) attaching a dicing tape surface by vacuum suction to a suction surface, and
(h) delaminating the supporting substrate from the processed wafer by peeling-off at a temperature of the suction surface in the range of 10 to 100° C. By employing these steps, the supporting substrate can be easily delaminated from the processed wafer, and the subsequent dicing step can be easily carried out.

Also, after the step (e) of delaminating the processed wafer from the supporting substrate, a step (i) of removing the temporary adhesive layer remaining on the front surface of the delaminated wafer is preferably carried out.

There is a case where a part of the temporary adhesive layer, particularly the temporary adhesive layer (A), remains on the circuit-formed surface of the water that has been delaminated from the supporting substrate by the step (e). In this case, the step (i) is preferably performed. The removal of the temporary adhesive layer (A) and so on can be carried out, for example, by cleaning the wafer.

In the step (i), any cleaning solution can be used so long as the solution can dissolve the silicone-modified styrene base elastomer constituting the layer (A) in the temporary adhesive layer. Illustrative examples thereof include decane, isononane, p-menthane, pinene, and limonene. These solvents may be used alone, or in admixture of two or more kinds. If removal is difficult, a base or an acid may be added to the solvents. Examples of the usable base include amines such as ethanolamine, diethanolamine, triethanolamine, triethylamine, and ammonia, and ammonium salts such as tetramethyl ammonium hydroxide. Examples of the usable acid include organic acid such as acetic acid, oxalic acid, benzenesulfonic acid, and dodecylbenzenesulfonic acid. An amount of the base and acid to be added is 0.01 to 10% by mass, preferably 0.1 to 5% by mass in terms of a concentration in the cleaning solution. To improve removal efficiency of the residual matters, an existing surfactant may be added thereto. Cleaning may be performed with a paddle method by using the above-mentioned solution, a spraying method, or a dipping method in a cleaner tank. The temperature in this operation is suitably 10 to 80° C., preferably 15 to 65° C.; and if necessary, after dissolving the layer (A) by these dissolving solutions, it may be rinsed with water or an alcohol at the end of cleaning, and then dried to obtain a thinned wafer.

EXAMPLES

In the following, the present invention will be specifically described with reference to Examples and Comparative Example, but the present invention is not limited to these Examples.

Synthesis Example 1

In a flask equipped with a stirrer, a thermometer, a nitrogen purge system, and a reflux condenser, 43.1 g of 9,9'-bis(3-allyl-4-hydroxyphenyl)fluorene (M-1), 29.5 g of organohydrogenpolysiloxane having an average structural formula (M-3), 135 g of toluene, and 0.04 g of chloroplatinic acid were placed, and heated at 80° C. Then, 17.5 g of 1,4-bis(dimethylsilyl)benzene (M-5) was added dropwise into the flask over 1 hour. At this time, the temperature inside the flask was increased to 85° C. After completion of dropwise addition, the mixture was aged at 80° C. for 2 hours, toluene was distilled off, and 80 g of cyclohexanone was added to obtain a resin solution having a concentration of the resin solid of 50% by mass with cyclohexanone as a solvent. The molecular weight of the resin in the solution was determined by GPC, and the weight average molecular weight was 45,000 in terms of polystyrene. Further, to 50 g of the resin solution were added 7.5 g of epoxy crosslinker, EOCN-1020 available from NIPPON KAYAKU Co., Ltd. as a crosslinker, 0.2 g of BSDM (bis(tert-butylsulfonyl)diazomethane) available from Wako Pure Chemical Industries Ltd. as a curing catalyst, and 0.1 g of tetrakis[methylene-(3,5-di-tert-butyl-4-hydroxyhydrocinnamate)]methane (trade name: Adekastab AO-60) as an antioxidant, and the solution was filtered through 1 µm of a membrane filter to obtain a resin solution (B-1).

Synthesis Example 2

In a flask equipped with a stirrer, a thermometer, a nitrogen purge system, and a reflux condenser, 84.1 g of epoxy compound (M-2) was dissolved in 600 g of toluene. 294.6 g of compound (M-3) and 25.5 g of compound (M-4) were then added to the solution, and heated at 60° C. Thereafter, 1 g of carbon carried platinum catalyst (5% by mass) was added thereto, and after confirming that the internal reaction temperature was increased to 65 to 67° C., the mixture was further heated to 90° C., and aged for 3 hours. Then, the mixture was cooled to room temperature, and 600 g of methyl isobutyl ketone (MIBK) was added thereto. The reaction solution was filtered under pressure through a filter to remove the platinum catalyst. The solvent in the resin solution was distilled off under reduced pressure, and 280 g of propylene glycol monomethyl ether acetate (PGMEA) was added to obtain a resin solution having a concentration of the solid component of 60% by mass with PGMEA as a solvent. The molecular weight of the resin in the resin solution was determined by GPC, and the weight average molecular weight was 28,000 in terms of polystyrene. Further, to 100 g of the resin solution were added 9 g of a tetra-functional phenol compound, TEP-TPA (available from Asahi Organic Chemicals Industry Co., Ltd.), and 0.2 g of tetrahydrophthalic anhydride (available from New Japan Chemical Co., Ltd., RIKACID HH-A), and the solution was filtered through 1 µm of a membrane filter to obtain a resin solution (B-2).

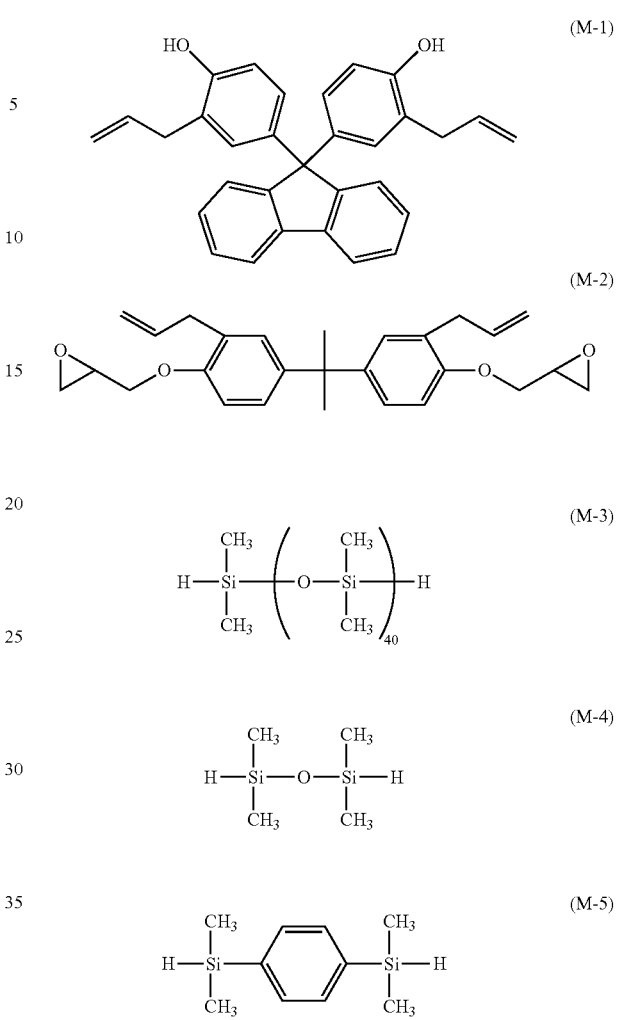

Synthesis Example 3

In a flask equipped with a stirrer, a thermometer, a nitrogen purge system, and a reflux condenser, 100 g of HYBRAR 5125 (polystyrene/vinyl-polyisoprene copolymer containing 20% by mass of styrene, glass transition temperature –13° C.) was dissolved in 300 g of toluene. Into this solution was added a platinum catalyst in a ratio of platinum atom to the resin containing SiH group of 20 ppm. Then, 18.1 g of compound (SiH equivalent of 1051.6 g/mol) shown by the following formula (9) was added dropwise thereinto at 60° C. This amount corresponds to 0.57 of H/Vi ratio (ratio of the amount of SiH groups to the total amount of alkenyl groups). The reaction was carried out at 100° C. for 2 hours, and then brought to completion. Thereafter, the resultant solution was concentrated by distillation under reduced pressure, and toluene was removed to solidify a reaction product, thereby a silicone-modified styrene base thermoplastic elastomer was obtained. The silicone-modified styrene base thermoplastic elastomer was then dissolved in p-menthane, and filtered through 1 µm of a membrane filter to obtain a first temporary adhesive composition A-1. The silicone content in the composition A-1 was 15.3% by mass. Incidentally, the silicone content was measured by Si-NMR.

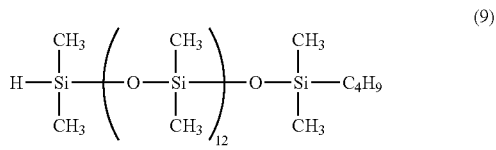

(9)

Synthesis Example 4

In a flask equipped with a stirrer, a thermometer, a nitrogen purge system, and a reflux condenser, 100 g of HYBRAR 5125 was dissolved in 300 g of toluene. Into this solution was added a platinum catalyst in a ratio of platinum atom to the resin of 20 ppm. Then, 10.5 g of compound (SiH equivalent of 2036.4 g/mol) shown by the following formula (10) was added dropwise thereinto at 60° C. This amount corresponds to 0.17 of H/Vi ratio (ratio of the amount of SiH groups to the total amount of alkenyl groups). The reaction was carried out at 100° C. for 2 hours, and then brought to completion. Thereafter, the resultant solution was concentrated by distillation under reduced pressure, and toluene was removed to solidify a reaction product, thereby a silicone-modified styrene base elastomer was obtained. The silicone-modified styrene base elastomer was then dissolved in p-menthane, and filtered through 1 μm of a membrane filter to obtain a first temporary adhesive composition A-2. The silicone content in the composition A-2 was 9.5% by mass.

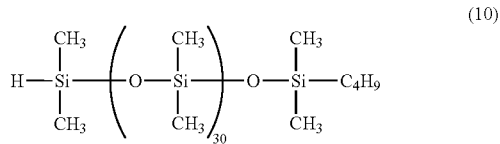

(10)

Synthesis Example 5

In a flask equipped with a stirrer, a thermometer, a nitrogen purge system, and a reflux condenser, 100 g of HYBRAR 5125 was dissolved in 300 g of toluene. Into this solution was added a platinum catalyst in a ratio of platinum atom to the resin of 20 ppm. Then, 15.3 g of compound (SiH equivalent of 3842.2 g/mol) shown by the following formula (11) was added dropwise thereinto at 60° C. This amount corresponds to 0.13 of H/Vi ratio (ratio of the amount of SiH groups to the total amount of alkenyl groups). The reaction was carried out at 100° C. for 2 hours, and then brought to completion. Thereafter, the resultant solution was concentrated by distillation under reduced pressure, and toluene was removed to solidify a reaction product, thereby a silicone-modified styrene base elastomer was obtained. The silicone-modified styrene base elastomer was then dissolved in p-menthane, and filtered through 1 μm of a membrane filter to obtain a first temporary adhesive composition A-3. The silicone content in the composition. A-3 was 13.3% by mass.

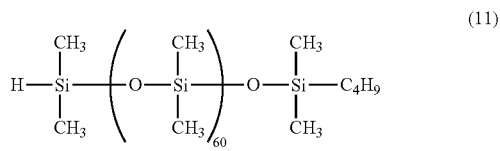

(11)

Synthesis Example 6

In a flask equipped with a stirrer, a thermometer, a nitrogen purge system, and a reflux condenser, 100 g of HYBRAR 5125 was dissolved in 300 g of toluene. Into this solution was added a platinum catalyst in a ratio of platinum atom to the resin of 20 ppm. Then, 5.8 g of compound (SiH equivalent of 2036.4 g/mol) shown by the above formula (10) was added dropwise thereinto at 60° C. This amount corresponds to 0.09 of H/Vi ratio (ratio of the amount of SiH groups to the total amount of alkenyl groups). The reaction was carried out at 100° C. for 2 hours, and then brought to completion. Thereafter, the resultant solution was concentrated by distillation under reduced pressure, and toluene was removed to solidify a reaction product, thereby a silicone-modified styrene base elastomer was obtained. The silicone-modified styrene base elastomer was then dissolved in p-menthane, and filtered through 1 μm of a membrane filter to obtain a first temporary adhesive composition A-4. The silicone content in the composition A-4 was 5.5% by mass.

Synthesis Example 7

In a flask equipped with a stirrer, a thermometer, a nitrogen purge system, and a reflux condenser, 100 g of HYBRAR 5125 was dissolved in 300 g of toluene. Into this solution was added a platinum catalyst in a ratio of platinum atom to the resin of 20 ppm. Then, 0.5 g of compound (SiH equivalent of 1051.6 g/mol) shown by the above formula (9) was added dropwise thereinto at 60° C. This amount corresponds to 0.02 of H/Vi ratio (ratio of the amount of SiH groups to the total amount of alkenyl groups). The reaction was carried out at 100° C. for 2 hours, and then brought to completion. Thereafter, the resultant solution was concentrated by distillation under reduced pressure, and toluene was removed to solidify a reaction product, thereby a silicone-modified styrene base elastomer was obtained. The silicone-modified styrene base elastomer was then dissolved in p-menthane, and filtered through 1 μm of a membrane filter to obtain a first temporary adhesive composition A-5. The silicone content in the composition A-5 was 0.5% by mass.

Synthesis Example 8

In a flask equipped with a stirrer, a thermometer, a nitrogen purge system, and a reflux condenser, 100 g of HYBRAR 5125 was dissolved in 300 g of toluene. Into this solution was added a platinum catalyst in a ratio of platinum atom to the resin of 20 ppm. Then, 55.3 g of compound (SiH equivalent of 3842.2 g/mol) shown by the above formula (11) was added dropwise thereinto at 60° C. This amount corresponds to 0.48 of H/Vi ratio (ratio of the amount of SiH groups to the total amount of alkenyl groups). The reaction was carried out at 100° C. for 2 hours, and then brought to completion. Thereafter, the resultant solution was concentrated by distillation under reduced pressure, and toluene was removed to solidify a reaction product, thereby a silicone-modified styrene base elastomer was obtained. The silicone-modified styrene base elastomer was then dissolved in p-menthane, and filtered through 1 μm of a membrane filter to obtain a first temporary adhesive composition A-6. The silicone content in the composition A-6 was 35.6% by mass.

Examples 1 to 7 and Comparative Example 1

Next, Examples and Comparative Example will be shown. In Comparative Example of the present invention, D-1 of the layer (A) shown in Table 1 was obtained by dissolving SEPTON4033 [hydrogenated poly(isoprene/butadiene) block copolymer] (SEEPS, available from Kuraray Co., Ltd.) in p-menthane such that the solid component becomes 10%, and subjecting the solution to filtration through 1 μm of a membrane filter.

To a 200-mm silicon wafer (thickness: 725 μm) whose entire surface was formed with copper posts having height of 10 μm and diameter of 40 μm was applied a material corresponding to the layer (A) by spin coating, and heated by a hot plate at 150° C. for 5 minutes to form a film with thickness shown in Table 1 on the bump-formed surface of the wafer. On the other hand, a glass plate having a diameter of 200 mm (thickness: 500 μm) was used as a support, and onto the glass support was firstly applied the polymer solution corresponding to the layer (3) by spin coating, and heated by a hot plate at 150° C. to form a film with thickness shown in Table 1. The wafer having the layer (A) and the glass plate having the layer (B) thus obtained were bonded so that the respective resin surfaces faced each other, in a vacuum adhesion equipment under the conditions shown in Table 1, thereby preparing a bonded wafer processing laminate.

Here, a glass plate was used as a support for the purpose of visually observing abnormalities after adhering the substrate, but a substrate such as a wafer, which does not transmit light, can be also used.

Thereafter, with regard to the bonded substrate, the following tests were carried out, and the results of Examples and Comparative Example were shown in Table 1. Also, evaluations were carried out by the order as mentioned below. When the result became anomaly (the judgment is "poor") during the tests and it is no longer impossible to evaluate, the evaluation thereafter was stopped, and showed with "-" in Table 1.

—Adhesiveness Test—

The wafer with a diameter of 200 mm was bonded by using a wafer bonding apparatus EVG520IS manufactured by EV group. Bonding was carried out at bonding temperature (adhesion temperature) shown in Table 1, under chamber internal pressure during bonding of $10^{-3}$ mbar or less, with load of 5 kN. After bonding, the substrate was once heated in an oven at 180° C. for 1 hour to cure the layer (B). After cooling to room temperature, the adhered state of the interface was visually observed. When no abnormalities like bubbles was found at the interface, the sample was evaluated as good, and shown with "good". When abnormalities were found, the sample was evaluated as poor, and shown with "poor".

—Back Surface Grinding Resistance Test—

The back surface of the silicon wafer was ground by a grinder (DAG810 manufactured by DISCO Co., Ltd.) using a diamond grinding wheel. After the wafer was ground to a final substrate thickness of 50 μm, abnormities such as crack and delaminating were checked by an optical microscope (100-folds). When no abnormities was found, the sample was evaluated as good, and shown with "good", and when abnormities were found, the sample was evaluated as poor, and shown with "poor".

—Heat Resistance Test—

After the back surface of the silicon wafer had been ground, the laminate was placed in an oven under reduced pressure at 180° C. for 30 minutes or 2 hours, abnormalities in the appearance of the laminate was then checked. When no appearance abnormalities was found, the sample was evaluated as good, and shown with "good". When delamination occurs only at the outer circumferential portion, the sample was evaluated as moderate, and shown with "moderate", and when appearance abnormalities (delamination of whole surfaces) were found, the sample was evaluated as poor, and shown with "poor".

—Delaminatability Test—

Delaminatability of the substrate was evaluated in the following manner. First, onto the wafer side that has been thinned to 50 μm was adhered a dicing tape by using a dicing frame, and then, this dicing tape surface was set to a suction plate by vacuum suction. Then, one point of the supporting substrate was lifted by tweezers at room temperature to delaminate the supporting substrate. When it could be delaminated without cracking the 50 μm wafer, the sample was evaluated as good, and shown with "good", when it could be delaminated although the supporting substrate was cracked, the sample was evaluated as moderate, and shown with "moderate", and when it could not be delaminated at all, the sample was evaluated as poor, and shown with "poor".

—Cleaning Removability Test—

After the delaminatability test, the 200 mm wafer (that had been exposed to the heat resistance test conditions) mounted on the dicing frame via the dicing tape was set on a spin coater, with the adhesive layer upside. p-menthane was sprayed for 5 minutes as a cleaning solution, and then, rinsing was carried out by spraying isopropyl alcohol (IPA) while rotating the wafer. Thereafter, appearance of the wafer was observed, and the residue of the adhesive material resin was visually checked. When there was no residue of the resin, the sample was evaluated as good, and shown with "good", and when there was the residue, the sample was evaluated as poor, and shown with "poor".

—Peeling Force Test—

The polymer layer (B) was formed on the silicon wafer used as the supporting substrate, and the polymer layer (A) was then formed on the layer (B), under the same condition as in Examples and Comparative Example, respectively. Thereafter, five polyimide tapes with a length of 150 mm and a width of 25 mm were adhered thereto, and a part of the temporary adhesive layer to which no tape was adhered was removed. By using AUTOGRAPH (AG-1) manufactured by Shimadzu Co., 120 mm of the tapes were peeled off from one end thereof with 180° peeling, and an average of the forces applied to that time (120 mm stroke×5 times) was measured as a peeling force of the temporary adhesive layer.

—Overall Evaluation—

Based on the above evaluation results, the samples were evaluated whether it is usable as a method for manufacturing a thin wafer, and judged as "very good", "good" or "poor".

TABLE 1

|  | Example 1 | Example 2 | Example 3 | Example 4 | Example 5 | Example 6 | Example 7 | Comparative Example 1 |
|---|---|---|---|---|---|---|---|---|
| Resin layer (A) | A-1 | A-2 | A-3 | A-4 | A-1 | A-5 | A-6 | D-1 |
| Film thickness of layer (A) | 5 μm | 5 μm | 5 μm | 5 μm | 10 μm | 5 μm | 5 μm | 5 μm |

TABLE 1-continued

| | Example 1 | Example 2 | Example 3 | Example 4 | Example 5 | Example 6 | Example 7 | Comparative Example 1 |
|---|---|---|---|---|---|---|---|---|
| Peel force of layer (A) | 5 gf | 20 gf | 12 gf | 40 gf | 8 gf | 60 gf | <1 gf | >100 gf |
| Resin layer (B) | B-1 | B-2 | B-1 | B-2 | B-2 | B-1 | B-1 | B-1 |
| Film thickness of layer (B) | 50 μm | 50 μm | 50 μm | 50 μm | 30 μm | 50 μm | 50 μm | 50 μm |
| Adhesion temperature | 120° C. | 130° C. | 120° C. | 130° C. | 130° C. | 120° C. | 120° C. | 120° C. |
| Adhesiveness | good | good | good | good | good | good | good | good |
| Back surface grinding resistance | good | good | good | good | good | good | good | good |
| Heat resistance (30 min/2 h) | good/good | good/good | good/good | good/good | good/good | good/good | good/moderate | good/good |
| Delaminatability | good | good | good | good | good | moderate | good | poor |
| Cleaning Removability | good | good | good | good | good | good | good | — |
| Overall Evaluation | very good | very good | very good | very good | very good | good | good | poor |

As shown in Table 1, it could be clarified that Examples 1 to 7, which satisfy the requirements of the present invention, facilitate temporary adhesion and delamination. In particular, Examples 1 to 5 shows excellent heat resistance and delaminatability because the silicone content is in the range of 1 to 30 parts by mass and the peeling force is in the range of 2 to 50 gf. On the other hand, in Comparative example 1, in which the layer (A) does not satisfy. the requirements of the present invention, the wafer could not be delaminated at all in the delaminatability test.

It should be noted that the present invention is not limited to the above-described embodiments. The above-described embodiments are described for illustrative purposes, and those having substantially the same configuration and those providing the same operational advantage as the technical concept described in the claims of the present invention are all encompassed in the technical scope of the present invention.

The invention claimed is:

1. A temporary adhesive material for a wafer processing, the temporary adhesive material being used for temporarily bonding a supporting substrate to a wafer having a front surface including a circuit formed thereon and a back surface to be processed, comprising: a first temporary adhesive layer composed of a layer (A) of a silicone-modified styrene base thermoplastic elastomer; and a second temporary adhesive layer composed of a thermosetting polymer layer (B) laminated on the first temporary adhesive layer, wherein the layer (A) is capable of releasably adhering to the front surface of the wafer, and the layer (B) is capable of releasably adhering to the supporting substrate.

2. The temporary adhesive material for a wafer processing according to claim 1, wherein the silicone-modified styrene base thermoplastic elastomer is a silicone-modified block copolymer, and a content of a styrene unit in the copolymer is in the range of 10 to 40% by mass.

3. The temporary adhesive material for a wafer processing according to claim 2, wherein the silicone-modified styrene base thermoplastic elastomer contains a silicone unit represented by the following general formula (1),

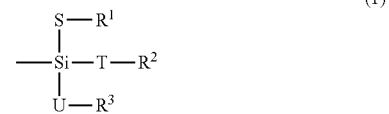

wherein $R^1$, $R^2$, and $R^3$ independently represent a substituted or unsubstituted monovalent hydrocarbon group having 1 to 10 carbon atoms; S, T, and U each are a single bond or a divalent siloxane structure represented by the following general formula (2), provided that at least one of S, T, and U is the divalent siloxane structure represented by the general formula (2),

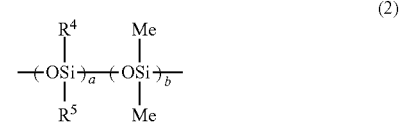

wherein $R^4$ and $R^5$ independently represent a substituted or unsubstituted monovalent hydrocarbon group having 1 to 10 carbon atoms; Me is a methyl group; "a" and "b" each are 0 or a positive number; and a+b is an integer of 1 or more.

4. The temporary adhesive material for a wafer processing according to claim 3, wherein a 180° peeling force of a test piece having a width of 25 mm of the layer (A) of the silicone-modified styrene base thermoplastic elastomer is from 2 to 50 gf.

5. The temporary adhesive material for a wafer processing according to claim 3, wherein the thermosetting polymer layer (B) is a cured layer of a composition containing 100 parts by mass of a siloxane bond-containing polymer having a repeating unit represented by the following general formula (3) and a weight average molecular weight of 3,000 to 500,000, and 0.1 to 50 parts by mass of a crosslinker selected from the group consisting of an amino condensate, a melamine resin, a urea resin each modified with formalin or formalin-alcohol, a phenol compound having on average two or more methylol or alkoxymethylol groups per molecule, and an epoxy compound having on average two or more epoxy groups per molecule,

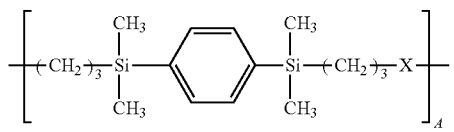

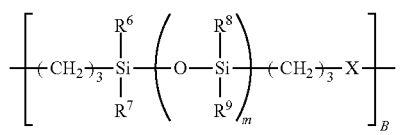

wherein $R^6$ to $R^9$ may be the same or different, and represent a monovalent hydrocarbon group having 1 to 8 carbon atoms; "m" is an integer of 1 to 100; B is a positive number; A is 0 or a positive number; and X is a divalent organic group represented by the following general formula (4),

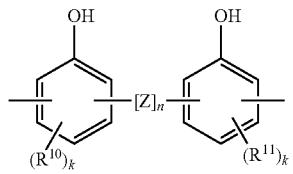

wherein Z represents a divalent organic group selected from any of

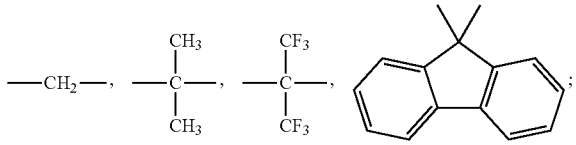

"n" represents 0 or 1; $R^{10}$ and $R^{11}$ each represent an alkyl or alkoxy group having 1 to 4 carbon atoms, and may be the same or different from each other; and "k" represents any of 0, 1, and 2.

6. The temporary adhesive material for a wafer processing according to claim 3, wherein the thermosetting polymer layer (B) is a cured layer of a composition containing 100 parts by mass of a siloxane bond-containing polymer having a repeating unit represented by the following general formula (5) and a weight average molecular weight of 3,000 to 500,000, and 0.1 to 50 parts by mass of a crosslinker selected from the group consisting of a phenol compound having on average two or more phenol groups per molecule and an epoxy compound having on average two or more epoxy groups per molecule,

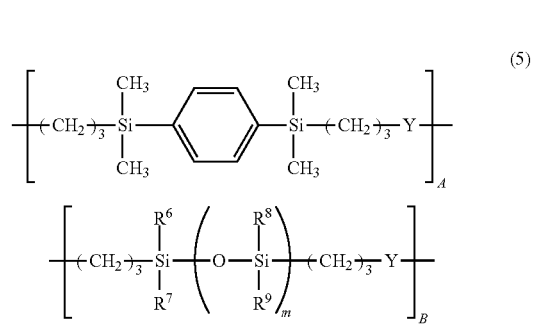

wherein $R^6$ to $R^9$ may be the same or different, and represent a monovalent hydrocarbon group having 1 to 8 carbon atoms; "m" is an integer of 1 to 10C; B is a positive number; A is 0 or a positive number; and Y is a divalent organic group represented by the following general formula (6),

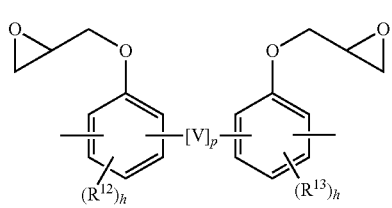

wherein V represents a divalent organic group selected from any of

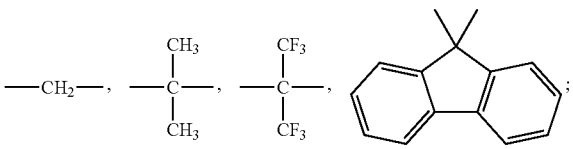

"p" represents 0 or 1; $R^{12}$ and $R^{13}$ each represent an alkyl or alkoxy group having 1 to 4 carbon atoms, and may be the same or different from each other; and "h" represents any of 0, 1, and 2.

7. The temporary adhesive material for a wafer processing according to claim 2, wherein a 180° peeling force of a test piece having a width of 25 mm of the layer (A) of the silicone-modified styrene base thermoplastic elastomer is from 2 to 50 gf.

8. The temporary adhesive material for a wafer processing according to claim 2, wherein the thermosetting polymer layer (B) is a cured layer of a composition containing 100 parts by mass of a siloxane bond-containing polymer having a repeating unit represented by the following general formula (3) and a weight average molecular weight of 3,000 to 500,000, and 0.1 to 50 parts by mass of a crosslinker selected from the group consisting of an amino condensate, a melamine resin, a urea resin each modified with formalin or formalin-alcohol, a phenol compound having on average two or more methylol or alkoxymethylol groups per molecule, and an epoxy compound having on average two or more epoxy groups per molecule,

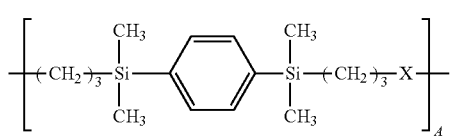  (3)

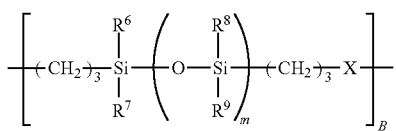

wherein $R^6$ to $R^9$ may be the same or different, and represent a monovalent hydrocarbon group having 1 to 8 carbon atoms; "m" is an integer of 1 to 100; B is a positive number; A is 0 or a positive number; and X is a divalent organic group represented by the following general formula (4),

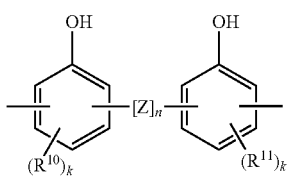  (4)

wherein Z represents a divalent organic group selected from any of

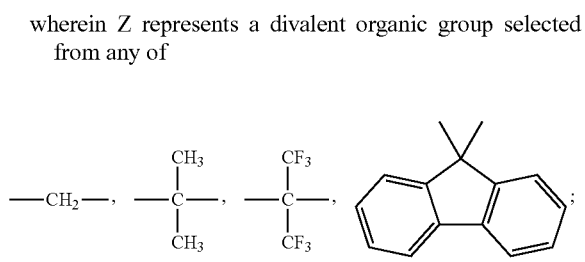

"n" represents 0 or 1; $R^{10}$ and $R^{11}$ each represent an alkyl or alkoxy group having 1 to 4 carbon atoms, and may be the same or different from each other; and "k" represents any of 0, 1, and 2.

9. The temporary adhesive material for a wafer processing according to claim 2, wherein the thermosetting polymer layer (B) is a cured layer of a composition containing 100 parts by mass of a siloxane bond-containing polymer having a repeating unit represented by the following general formula (5) and a weight average molecular weight of 3,000 to 500,000, and 0.1 to 50 parts by mass of a crosslinker selected from the group consisting of a phenol compound having on average two or more phenol groups per molecule and an epoxy compound having on average two or more epoxy groups per molecule,

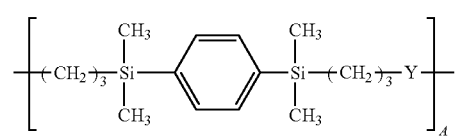  (5)

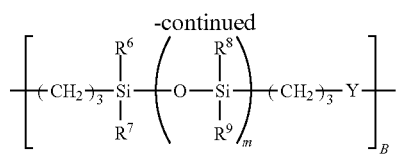

wherein $R^6$ to $R^9$ may be the same or different, and represent a monovalent hydrocarbon group having 1 to 8 carbon atoms; "m" is an integer of 1 to 100; B is a positive number; A is 0 or a positive number; and Y is a divalent organic group represented by the following general formula (6),

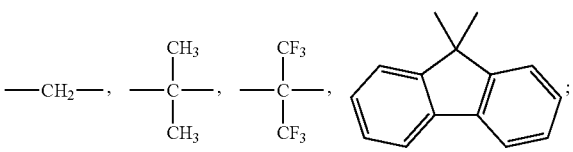  (6)

wherein V represents a divalent organic group selected from any of

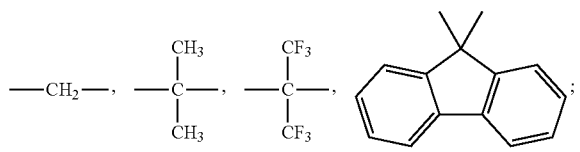

"p" represents 0 or 1; $R^{12}$ and $R^{13}$ each represent an alkyl or alkoxy group having 1 to 4 carbon atoms, and may be the same or different from each other; and "h" represents any of 0, 1, and 2.

10. The temporary adhesive material for a wafer processing according to claim 1, wherein the silicone-modified styrene base thermoplastic elastomer contains a silicone unit represented by the following general formula (1),

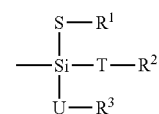  (1)

wherein $R^1$, $R^2$, and $R^3$ independently represent a substituted or unsubstituted monovalent hydrocarbon group having 1 to 10 carbon atoms; S, T, and U each are a single bond or a divalent siloxane structure represented by the following general formula (2), provided that at least one of S, T, and U is the divalent siloxane structure represented by the general formula (2),

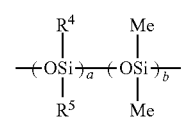  (2)

wherein $R^4$ and $R^5$ independently represent a substituted or unsubstituted monovalent hydrocarbon group having 1 to 10 carbon atoms; Me is a methyl group; "a" and "b" each are 0 or a positive number; and a+b is an integer of 1 or more.

11. The temporary adhesive material for a wafer processing according to claim 10, wherein a 180° peeling force of a test piece having a width of 25 mm of the layer (A) of the silicone-modified styrene base thermoplastic elastomer is from 2 to 50 gf.

12. The temporary adhesive material for a wafer processing according to claim 10, wherein the thermosetting polymer layer (B) is a cured layer of a composition containing 100 parts by mass of a siloxane bond-containing polymer having a repeating unit represented by the following general formula (3) and a weight average molecular weight of 3,000 to 500,000, and 0.1 to 50 parts by mass of a crosslinker selected from the group consisting of an amino condensate, a melamine resin, a urea resin each modified with formalin or formalin-alcohol, a phenol compound having on average two or more methylol or alkoxymethylol groups per molecule, and an epoxy compound having on average two or more epoxy groups per molecule,

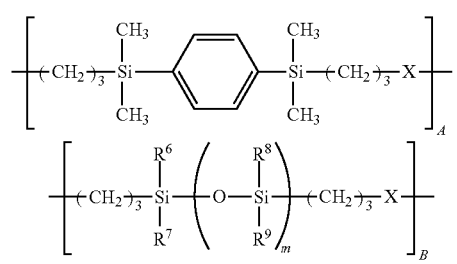
(3)

wherein $R^6$ to $R^9$ may be the same or different, and represent a monovalent hydrocarbon group having 1 to 8 carbon atoms; "m" is an integer of 1 to 100; B is a positive number; A is 0 or a positive number; and X is a divalent organic group represented by the following general formula (4),

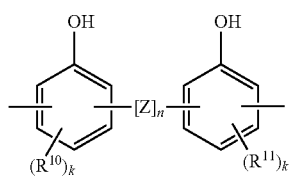
(4)

wherein Z represents a divalent organic group selected from any of

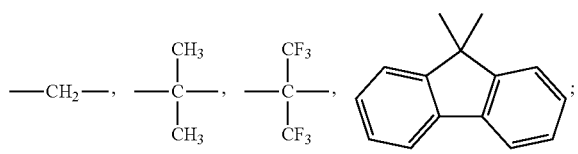

"n" represents 0 or 1; $R^{10}$ and $R^{11}$ each represent an alkyl or alkoxy group having 1 to 4 carbon atoms, and may be the same or different from each other; and "k" represents any of 0, 1, and 2.

13. The temporary adhesive material for a wafer processing according to claim 10, wherein the thermosetting polymer layer (B) is a cured layer of a composition containing 100 parts by mass of a siloxane bond-containing polymer having a repeating unit represented by the following general formula (5) and a weight average molecular weight of 3,000 to 500,000, and 0.1 to 50 parts by mass of a crosslinker selected from the group consisting of a phenol compound having on average two or more phenol groups per molecule and an epoxy compound having on average two or more epoxy groups per molecule,

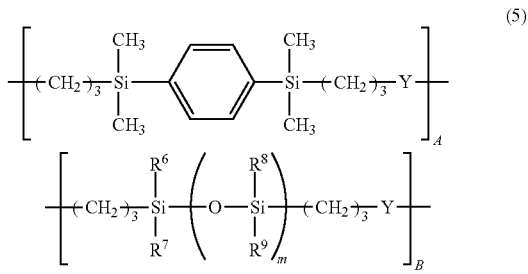
(5)

wherein $R^6$ to $R^9$ may be the same or different, and represent a monovalent hydrocarbon group having 1 to 8 carbon atoms; "m" is an integer of 1 to 100; B is a positive number; A is 0 or a positive number; and Y is a divalent organic group represented by the following general formula (6),

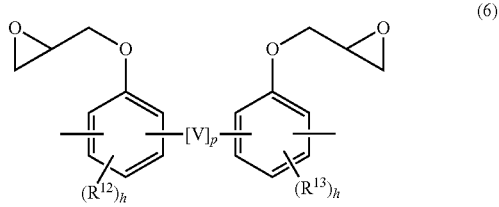
(6)

wherein V represents a divalent organic group selected from any of

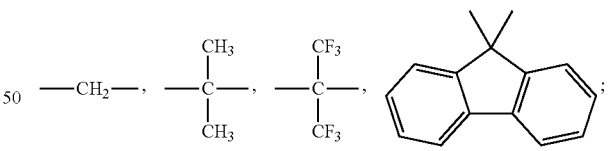

"p" represents 0 or 1; $R^{12}$ and Rn each represent an alkyl or alkoxy group having 1 to 4 carbon atoms, and may be the same or different from each other; and "h" represents any of 0, 1, and 2.

14. The temporary adhesive material for a wafer processing according to claim 1, wherein a 180° peeling force of a test piece having a width of 25 mm of the layer (A) of the silicone-modified styrene base thermoplastic elastomer is from 2 to 50 gf.

15. The temporary adhesive material for a wafer processing according to claim 1, wherein the thermosetting polymer layer (B) is a cured layer of a composition containing 100 parts by mass of a siloxane bond-containing polymer having a repeating unit represented by the following general formula (3) and a weight average molecular weight of 3,000 to 500,000, and 0.1 to 50 parts by mass of a crosslinker selected from the group consisting of an amino condensate, a melamine resin, a urea resin each modified with formalin or formalin-alcohol, a phenol compound having on average two or more methylol or alkoxymethylol groups per molecule, and an epoxy compound having on average two or more epoxy groups per molecule,

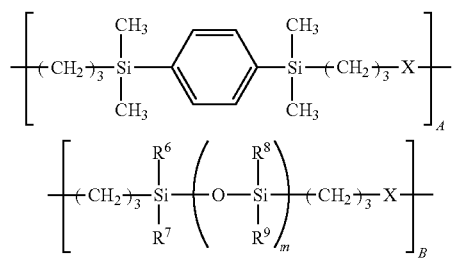

(3)

wherein $R^6$ to $R^9$ may be the same or different, and represent a monovalent hydrocarbon group having 1 to 8 carbon atoms; "m" is an integer of 1 to 100; B is a positive number; A is 0 or a positive number; and X is a divalent organic group represented by the following general formula (4),

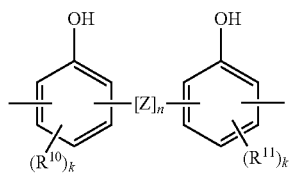

(4)

wherein Z represents a divalent organic group selected from any of

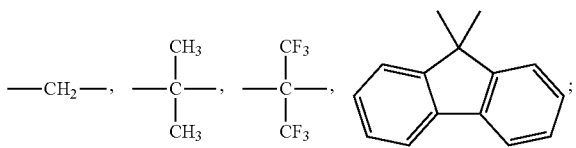

"n" represents 0 or 1; $R^{10}$ and $R^{11}$ each represent an alkyl or alkoxy group having 1 to 4 carbon atoms, and may be the same or different from each other; and "k" represents any of 0, 1, and 2.

16. The temporary adhesive material for a wafer processing according to claim 1, wherein the thermosetting polymer layer (B) is a cured layer of a composition containing 100 parts by mass of a siloxane bond-containing polymer having a repeating unit represented by the following general formula (5) and a weight average molecular weight of 3,000 to 500,000, and 0.1 to 50 parts by mass of a crosslinker selected from the group consisting of a phenol compound having on average two or more phenol groups per molecule and an epoxy compound having on average two or more epoxy groups per molecule,

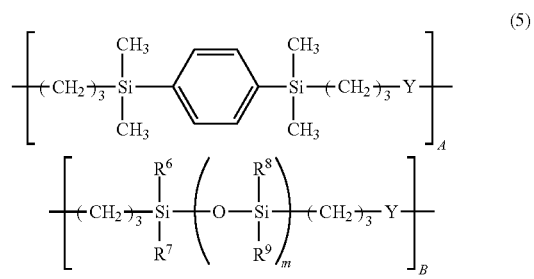

(5)

wherein $R^6$ to $R^9$ may be the same or different, and represent a monovalent hydrocarbon group having 1 to 8 carbon atoms; "m" is an integer of 1 to 100; B is a positive number; A is 0 or a positive number; and Y is a divalent organic group represented by the following general formula (6),

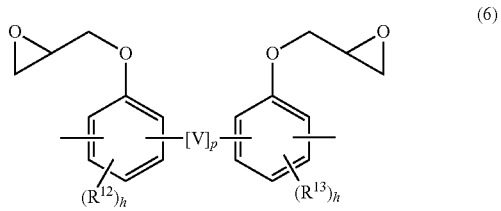

(6)

wherein V represents a divalent organic group selected from any of

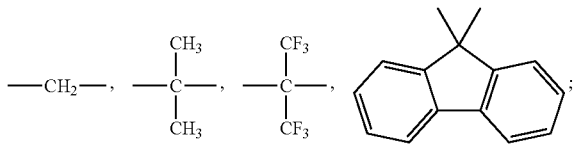

"p" represents 0 or 1; $R^{12}$ and $R^{13}$ each represent an alkyl or alkoxy group having 1 to 4 carbon atoms, and may be the same or different from each other; and "h" represents any of 0, 1, and 2.

17. A wafer processing laminate comprising a supporting substrate, a temporary adhesive layer composed of the temporary adhesive material for a wafer processing according to claim 1 formed thereon, and a wafer laminated on the temporary adhesive layer, the wafer having a front surface including a circuit formed thereon and a back surface to be processed, wherein
    the first temporary adhesive layer releasably adheres to the front surface of the wafer, and
    the second temporary adhesive layer releasably adheres to the supporting substrate.

18. A method for manufacturing a thin wafer comprising the steps of:
    bonding a front surface of a wafer to a supporting substrate via a temporary adhesive layer composed of the temporary adhesive material for a wafer processing according to claim 1, the wafer having the front surface including a circuit formed thereon and a back surface to be processed;
    heat curing the thermosetting polymer layer (B);
    grinding or polishing the back surface of the wafer bonded to the supporting substrate;

processing the ground or polished back surface of the wafer; and delaminating the processed wafer from the supporting substrate.

19. The method for manufacturing a thin wafer according to claim 18, wherein the temporary adhesive layer remaining on the front surface of the delaminated wafer is removed after the step of delaminating.

20. The method for manufacturing a thin wafer according to claim 18, wherein, in the step of bonding, the first temporary adhesive layer is formed on the front surface of the wafer, the second temporary adhesive layer is formed on the supporting substrate, and the front surface of the resultant wafer is bonded to the resultant supporting substrate, or the first temporary adhesive layer is formed on the front surface of the wafer, the second temporary adhesive layer is then formed on the first temporary adhesive layer, and the front surface of the resultant wafer is bonded to the supporting substrate.

* * * * *